United States Patent [19]

Demmer et al.

[11] Patent Number: 5,002,858

[45] Date of Patent: Mar. 26, 1991

[54] PROCESS FOR THE FORMATION OF AN IMAGE

[75] Inventors: Christopher G. Demmer, Essex; Edward Irving, Cambridge, both of United Kingdom

[73] Assignee: Ciba-Geigy Corporation, Ardsley, N.Y.

[21] Appl. No.: 434,599

[22] Filed: Nov. 7, 1989

Related U.S. Application Data

[63] Continuation of Ser. No. 177,229, Apr. 4, 1988, abandoned.

[30] Foreign Application Priority Data

Apr. 11, 1987 [GB] United Kingdom ............. 8708747

[51] Int. Cl.$^5$ ............................................. G03F 7/38
[52] U.S. Cl. .................................. 430/325; 430/190; 430/192; 430/328; 430/330; 430/935
[58] Field of Search ............. 430/190, 192, 193, 325, 430/326, 328, 330, 935

[56] References Cited

U.S. PATENT DOCUMENTS

| | | | |
|---|---|---|---|
| 4,104,070 | 8/1978 | Moritz et al. | 430/329 |
| 4,576,901 | 3/1986 | Stahlhofen et al. | 430/325 |
| 4,581,321 | 4/1986 | Stahlhofen | 430/325 |
| 4,632,900 | 12/1986 | Demmer et al. | 430/323 |
| 4,696,891 | 9/1987 | Guzzi | 430/325 |

FOREIGN PATENT DOCUMENTS 0211350 2/1987 European Pat. Off. .

OTHER PUBLICATIONS

Derwent Abstract of DE 3,437,687, 4/19/86.
Chem. Abstract, 93:195530y.

*Primary Examiner*—Jose G. Dees
*Attorney, Agent, or Firm*—Stephen V. O'Brien

[57] ABSTRACT

A process for the formation of an image comprises
  (i) electrodepositing on a conductive surface a layer of a quinone diazide positive photoresist,
  (ii) subjecting the layer to radiation in a predetermined pattern,
  (iii) heating the layer such that areas thereof exposed in stage (ii) are rendered insoluble in an aqueous base developer,
  (iv) subjecting the layer to radiation such that the areas not exposed in stage (ii) are rendered more soluble in an aqueous base developer than the areas rendered insoluble in stage (iii) and
  (v) removing the areas not exposed in stage (ii) by treatment with an aqueous base developer.

The process is useful in the production of printing plates and printed circuits.

19 Claims, No Drawings

PROCESS FOR THE FORMATION OF AN IMAGE

This application is a continuation of application Ser. No. 177,229, filed 4/4/88 now abandoned.

This invention relates to a process for the formation of an image which is useful in the production of printing plates and printed circuits.

In U.S. Pat. No. 4 632 900 there is described a process for the production of a positive image which comprises applying to a substrate by electrodeposition a layer of a positive photoresist, which can be a resin containing a quinone diazide residue and a salt-forming group, exposing the electrodeposited layer to radiation in a predetermined pattern, such that the exposed areas of the electrodeposited layer become more soluble in a developer than the unexposed areas, and removing the exposed areas by contact with a developer.

Quinone diazide-containing resins suitable for use in such a process are also described in European Patent Publications Nos. 0 184 553 and 0 196 999.

It has now been found that an image having good thermal stability and high resistance to solvents used as developers can be obtained by heating an electrodeposited quinone diazide-containing layer after irradiation in a predetermined pattern and then subjecting the layer to blanket, i.e. non-imagewise, irradiation before development. When an aqueous base is used as developer, a negative image is obtained, rather than a positive image as in the process of U.S. Pat. No. 4,632,900.

It is known, from U.S. Pat. Nos. 4,104,070 and 4,581,321, European Patent Publications Nos. 0 141 400 and 0 211 350, W. German Offenlegungsschrift 3 437 687 and Japanese Kokai 55-32088, that the initial latent positive image obtained on imagewise irradiation of a layer of a quinone diazide sulphonyl ester-modified phenolic novolak resin can be reversed by adding to the resin a material which converts the exposed areas into aqueous base-insoluble material on heating the resin layer after imagewise irradiation.

The present invention provides a process for the formation of an image which comprises (i) electrodepositing on a conductive surface a layer of a quinone diazide positive photoresist, (ii) subjecting the layer to radiation in a predetermined pattern, (iii) heating the layer such that areas thereof exposed in stage (ii) are rendered insoluble in an aqueous base developer, (iv) subjecting the layer to radiation such that the areas not exposed in stage (ii) are rendered more soluble in an aqueous base developer than the areas rendered insoluble in stage (iii) and (v) removing the areas not exposed in stage (ii) by treatment with an aqueous base developer.

The photoresist layer may be formed by electrodeposition from a solution or dispersion in an aqueous medium of (A) a film-forming electrodepositable resin having a photosensitive o-quinone diazide residue; or a mixture of (B) a photosensitive o-quinone diazide compound and (C) a film-forming electrodepositable resin; or a mixture of (A) with (B) and/or (C).

In some preferred embodiments, the resin (A) or the resin (C) contains a cationic amino group.

As is well understood in the art of image formation from quinone diazides, exposure of a quinone diazide to radiation produces a substituted indenecarboxylic acid. When neither the resin (A) nor the resin (C) contains a cationic amino group, the photoresist layer contains, or is contacted in stage (iii) with, a material (D) which interacts with the material produced in the exposed areas in stage (ii) to produce aqueous base-insoluble material on heating in stage (iii). Such materials (D) are known from publications cited above.

The material (D) may be a substance which converts carboxyl groups, on heating, into aqueous base-insoluble groups, for example by catalysing thermal decarboxylation. Suitable such substances include ammonia, organic bases and their salts, and phosphonium salts. Examples of suitable organic bases include dialkylamines such as diethylamine, di-n-butylamine and diamylamine, trialkylamines such as triethylamine, tri-n-butylamine, triamylamine and tri-iso-amylamine and aromatic amines, usually tertiary aromatic amines such as N,N-diethylaniline or N,N-di-n-propylaniline. Other suitable organic bases include 1-hydroxyalkyl-2-alkylimidazolines such as those described in U.S. Pat. No. 4,104,070, alkanolamines such as described in Japanese Kokai 55-32088, quaternary ammonium hydroxides such as those described in European Patent Publication No. 0 141 400, and N-heterocyclic bases such as those described in European Patent Publication No. 0 211 350. Suitable salts of organic bases include quaternary ammonium salts such as those described in European Patent Publication No. 0 141 400. Suitable phosphonium salts include quaternary phosphonium salts such as those described in W. German Offenlegungsschrift No. 3 437 687.

The material (D) may alternatively be a substance which undergoes a crosslinking reaction on heating with the material produced in the exposed areas in stage (ii). Suitable such crosslinking materials (D) include aminoplast resins, for example melamine-formaldehyde resins such as those described in U.S. Pat. No. 4,581,321.

If desired, the material (D) may be used where the resin (A) or the resin (C) has a cationic amino group. Preferably, where the presence of the material (D) is necessary or desired, it is included in the aqueous electrodeposition medium. The amount of (D) is generally from 0.1 to 50% by weight of the solids content of the solution or dispersion. When (D) is an organic base, it is usually present in an amount of 0.1 to 10%, preferably 0.2 to 5%, by weight of the solution or dispersion.

Preferably, the material (D) is an organic base. Preferred organic bases are alkanolamines such as ethanolamine, diethanolamine, triethanolamine, and propanolamine; imidazoles such as imidazole, an alkyl-substituted imidazole e.g. 2-methylimidazole, 2-ethyl-4-methylimidazole, an aryl substituted imidazole, e.g. 2-phenylimidazole, or a benzimidazole; and 1-hydroxyethyl-2-alkylimidazolines, preferably those where the 2-alkyl residue has from 7 to 17 carbon atoms.

Suitable electrodeposition quinone diazide-containing resins (A) having a cationic amino group include resins having an o-quinone diazide sulphonyl residue, for example an o-benzoquinone diazide sulphonyl residue or, preferably, an o-naphthoquinone diazide sulphonyl residue, and at least one amino group which is present in at least partially ionised form in the aqueous medium. Such resins may be, for instance, partial reaction products of primary or secondary amino-group containing resins with an o-quinone diazide sulphonic acid or amide-forming derivative thereof such as the acid halide or $C_1$–$C_4$ alkyl ester thereof.

Other suitable such resins are o-benzoquinone diazide sulphonyl esters and, preferably, o-naphthoquinone diazide sulphonyl esters of acrylic polymers containing a hydroxyl group and a tertiary amino group. These acrylic polymers are preferably copolymers of a tertiary amino group-containing acrylate or methacrylate, particularly a dialkylaminoalkyl acrylate or methacrylate such as dimethylaminoethyl acrylate or methacrylate, with a hydroxyl-containing acrylate or methacrylate, particularly a hydroxyalkyl acrylate or methacrylate such as 2-hydroxyethyl methacrylate or 2-hydroxypropyl acrylate, optionally together with one or more other ethylenically unsaturated monomers such as styrene or alkyl acrylates or methacrylates, e.g. ethyl acrylate or methyl methacrylate.

Preferred electrodepositable quinone diazide-containing resins (A) having a cationic amino group are o-quinone diazide sulphonyl esters, particularly o-naphthoquinone diazide sulphonyl esters, of film-forming phenolic hydroxyl group-containing resins, the esters having at least one amino group which is present in at least partially ionised form in the aqueous medium. The phenolic hydroxyl group-containing resins are preferably novolak resins or polymers, including homopolymers and copolymers, of ethylenically unsaturated phenols. In the sulphonyl esters, the amino group may be attached directly to an aromatic ring derived from the phenolic hydroxyl group-containing resin; for example, the resin may be derived from an amino-substituted phenol. Preferably, the amino group is present in a group of formula

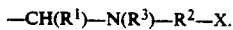    I attached to an aromatic ring in (A),
where $R^1$ denotes a hydrogen atom or an alkyl, usually $C_1$–$C_{20}$ alkyl, aryl, usually $C_6$–$C_{20}$ aryl, or carboxylic acid group, $R^2$ denotes a divalent aliphatic, aromatic or araliphatic group, usually having up to 20 carbon atoms, $R^3$ denotes a hydrogen atom or an alkyl, usually $C_1$–$C_{20}$ alkyl, group which may be substituted by an optionally esterified carboxyl group or by an optionally etherified hydroxyl group, or $R^2$ and $R^3$ together form an alkylene chain of 2 to 5 carbon atoms which may contain an additional oxygen or nitrogen atom in the chain, X denotes a hydrogen atom, a carboxyl group, a hydroxyl group or an amino group of formula —$N(R^4)R^5$, and $R^4$ and $R^5$, which may be the same or different, each denote a hydrogen atom or an alkyl, aryl, aralkyl or alkenyl group, usually having up to 20 carbon atoms, optionally substituted by a hydroxyl group.

Suitable o-quinone diazide sulphonyl esters, particularly o-naphthoquinone diazide sulphonyl esters, of phenolic resins having groups of formula I attached to aromatic rings are described in U.S. Pat. No. 4,632,900 and European Patent Publication No. 0 184 553. The group of formula I may be any of the groups of this formula disclosed in these two aforesaid publications. In preferred esters having one or more groups of formula I, $R^1$ denotes a hydrogen atom or a methyl, ethyl, phenyl or carboxyl group, $R^2$ denotes an alkylene group of 1 to 6 carbon atoms, which may be substituted by a carboxyl group, or a phenylene group, $R^3$ denotes a hydrogen atom or an alkyl group of 1 to 6 carbon atoms which may be substituted by a carboxyl or hydroxyl group, or $R^2$ and $R^3$ together form an alkylene chain of 4 carbon atoms containing an oxygen atom or an additional nitrogen atom in the chain, or an alkylene chain of 5 carbon atoms, X denotes a hydrogen atom, a carboxyl or hydroxyl group or an amino group of formula —$N(R^4)R^5$ where $R^4$ and $R^5$ each denote a hydrogen atom or an alkyl group of 1 to 6 carbon atoms.

Suitable novolak resins from which o-quinone diazide sulphonyl esters (A) can be prepared include those described in U.S. Pat. No. 4,632,900 and EP-A-0 184 553. Preferred novolak resins are those derived from formaldehyde and either an alkyl-substituted phenol or a mixture thereof with phenol. Particularly preferred novolak resins are those derived from formaldehyde and either a mixture of cresols or a mixture of phenol and p-tert.butylphenol.

Suitable polymers of ethylenically unsaturated phenols include homopolymers of vinyl- or 1-propenyl-substituted phenols such as o-vinylphenol, m-vinylphenol, p-vinylphenol and halogenated derivatives thereof, and o-(1-propenyl)phenol, m-(1-propenyl)phenol, p-(1-propenyl)phenol and halogenated derivatives thereof; copolymers of any of the abovementioned phenols with at least one other polymerisable ethylenically unsaturated material, for example a styrene such as styrene itself, alpha-methylstyrene, 4-bromostyrene and 4-methylstyrene, an acrylic ester such as an alkyl acrylate or methacrylate or a hydroxyalkyl acrylate or methacrylate, or a vinyl ester such as vinyl acetate; and mixtures of two or more of the abovementioned homopolymers and/or copolymers. The addition homopolymers and copolymers of unsaturated phenols can be prepared using conventional polymerisation techniques, either from the unsaturated phenols themselves or from their esters or ethers. When the esters or ethers are used, the resulting polymers can be hydrolysed to convert the ester or ether groups to free phenolic hydroxyl groups. Preferred polymers of unsaturated phenols are the polymers, i.e. homopolymers or copolymers, of p-vinylphenol; amongst these, polymers having a weight average molecular weight of 1500 to 30,000 are particularly preferred, especially those having a phenolic hydroxyl content up to 8 equivalents/kg. When this hydroxyl content exceeds this value, it is preferably reduced by reaction of the polymer with an acyl halide such as acetyl chloride or benzoyl chloride or by reaction with a monoepoxide such as isooctyl glycidyl ether or phenyl glycidyl ether.

The amino group-containing o-quinone diazide sulphonyl esters of novolak resins can be prepared as described in U.S. Pat. No. 4,632,900 and EP-A-0184553. The corresponding esters of polymers of ethylenically unsaturated phenols can be prepared by analogous methods, replacing a starting novolak resin by a polymer of an ethylenically unsaturated phenol.

Suitable resins (C) having a cationic amino group include any of the known electrodepositable film-forming resins having at least one amino group which is present in the aqueous medium in at least partially ionised form. Examples of cationic amino group-containing resins are reaction products of an epoxide resin with a primary or secondary monoamine or a secondary diamine, particularly a reaction product of an epoxy resin, such as a diglycidyl ether of 2,2-bis(4-hydroxyphenyl)propane (bisphenol A), with an alkanolamine such as ethanolamine, diethanolamine or propanolamine; reaction products of a phenolic hydroxyl group-containing resin, such as a novolak resin, a polymer of an ethylenically unsaturated phenol or a phenolic hydroxyl-terminated adduct of an epoxide resin and a bisphenol, with an aldehyde and a primary or secondary amine, for example reaction products of a novolak resin or a poly(vinylphenol) with an aldehyde such as acetaldehyde, benzaldehyde or, preferably, formaldehyde, and an amine such as a dialkylamine, an alkylenediamine or an alkanolamine; polymers of basic group-containing acrylic materials such as homopolymers of dialkylaminoalkyl acrylates or methacrylates and copolymers thereof, including copolymers with other vinyl monomers, such as alkyl acrylates or methacrylates, and graft copolymers with acrylate or methacrylate group-containing resins such as esters of epoxide resins with acrylic or methacrylic acid; Michael addition reaction products of acrylate or methacrylate group-containing resins with a primary or secondary amine such as ethanolamine, diethanolamine or morpholine; reaction products of epoxide resins with an aminocarboxylic acid, an aminosulphonic acid or an aminophosphonic acid; and reaction products of a phenolic hydroxyl-group-containing resin, such as a novolak resin, a polymer of an ethylenically unsaturated phenol or a phenolic hydroxyl-terminated adduct of an epoxide resin and a bisphenol, with an aldehyde, such as acetaldehyde, benzaldehyde or, preferably, formaldehyde, and an aminocarboxylic, aminosulphonic or aminophosphonic acid.

Preferred resins (C) having an amino group which is present in the aqueous medium in at least partially ionised form are reaction products of a novolak resin, such as a novolak resin as hereinbefore described, an aldehyde, particularly formaldehyde, and a primary or secondary amine or an aminocarboxylic acid, for example an alkanolamine such as ethanolamine, diethanolamine or propanolamine or an aminocarboxylic acid such as sarcosine, glycine, aspartic acid, glutamic acid, iminodiacetic acid, anthranilic acid or p-aminobenzoic acid. These resins can be prepared by subjecting the reactants to conventional Mannich reaction conditions. Other preferred resins (C) are polymers of an acrylate or methacrylate containing a tertiary amino group, for example homopolymers of dimethylaminoethyl acrylate or methacrylate, or copolymers thereof with a $C_1$–$C_{12}$ alkyl or hydroxyalkyl acrylate or methacrylate and, optionally, one or more other vinyl monomers.

Suitable resins (A) having no cationic amino group include o-quinone diazide sulphonyl esters, particularly o-naphthoquinone diazide sulphonyl esters, of film-forming phenolic hydroxyl group-containing resins, the esters having at least one acidic group, particularly carboxyl group, which is present in at least partially ionised form in the aqueous medium. Preferred phenolic hydroxyl group-containing resins are novolak resins and polymers of ethylenically unsaturated phenols. Such anionic resins (A) can be o-quinone diazide sulphonyl esters of novolak resins derived from an aldehyde such as formaldehyde and a carboxyl-substituted phenol such as p-hydroxybenzoic acid or a phenolsulphonic acid, or a mixture thereof with phenol.

Preferred anionic resins (A) are those obtained by reacting the phenolic hydroxyl group-containing resin partially with an o-quinone diazide sulphonic acid or esterifying derivative thereof, particularly an o-naphthoquinone diazide sulphonic acid or esterifying derivative thereof, and partially with a polycarboxylic acid anhydride. Suitable novolak resins and polymers of ethylenically unsaturated phenols are those hereinbefore described as precursors of cationic resins (A), with the novolaks derived from formaldehyde and an alkyl-substituted phenol or a mixture thereof with phenol and the polymers of p-vinylphenol again being preferred. Preferably, the phenolic hydroxyl group-containing resin is reacted with an acid halide, usually acid chloride, of the o-quinone diazide sulphonic acid. The polycarboxylic acid anhydride may be an aliphatic, cycloaliphatic or aromatic polycarboxylic acid anhydride such as succinic, glutaric, methylsuccinic, iso-octenylsuccinic, maleic, tetrahydrophthalic, hexahydrophthalic, phthalic or trimellitic anhydride. The preferred anionic resins (A) derived from novolak resins, and their preparation, are described in EP-A-0196999. The preferred anionic resins (A) derived from polymers of ethylenically unsaturated phenols can be prepared by analogous methods.

Suitable resins (C) having no cationic amino group include any of the known electrodepositable film-forming resins having at least one acidic group which is present in the aqueous medium in at least partially ionised form. Examples of such resins are carboxyl-terminated diene polymers such as carboxyl-terminated homopolymers and copolymers of butadiene; polymers of ethylenically unsaturated carboxylic, sulphonic or phosphonic acids, particularly homopolymers and copolymers of acrylic or methacrylic acid; carboxyl-terminated polyesters; reaction products of hydroxyl group-containing resins, such as hydroxyl-terminated polyesters, polymers of hydroxyl-containing vinyl monomers, or hydroxyl group-containing epoxide resins, with polycarboxylic acid anhydrides; and carboxyl group-containing reaction products of epoxide resins with mercaptocarboxylic acids. Preferred such resins are carboxyl-terminated diene polymers, polymers of ethylenically unsaturated carboxylic acids and reaction products of a hydroxyl-containing resin with a polycarboxylic acid anhydride.

Photosensitive o-quinone diazide compounds suitable for use as (B) are well known. Examples include o-benzoquinone diazide sulphonyl or o-naphthoquinone diazide sulphonyl esters or amides of compounds, particularly aromatic compounds, having a hydroxy group or amino group respectively. Preferred o-quinone diazides are o-benzoquinone diazide sulphonyl and o-naphthoquinone diazide sulphonyl esters of phenols, including monohydric phenols and, particularly, polyhydric phenols such as 2,2-bis(hydroxyphenyl) propanes, dihydroxydiphenyls, di-and tri-hydroxy-substituted benzophenones, and phenolic resins, including phenol-aldehyde resins and polymers of phenols having polymerisable unsaturated substituents. Suitable phenol-aldehyde resins from which the esters may be derived include novolak resins prepared from phenol itself, an alkyl-substituted phenol such as o-, m- or p-cresol, o-, m- or p-tert.butyl-phenol, o-, m- or p-octylphenol, or bisphenol such as 2,2-bis(4-hydroxyphenyl)propane, or a mixture of two or more such phenols, and aldehyde such as acetaldehyde, benzaldehyde, glyoxylic acid or, preferably, formaldehyde. Suitable polymers of unsaturated phenols from which esters may be derived include homopolymers and copolymers of p-vinyl phenol and p-isopropenyl phenol.

Preferred o-quinone diazide sulphonyl esters of phenols are o-napthoquinone diazide sulponyl esters of polyhydroxybenzophenones or novolak resins derived from formaldehyde and an alkyl-substituted phenol or a mixture thereof with phenol. Particularly preferred esters are 1,2-naphthoquinone-2-diazide-5-sulphonyl esters of dihydroxybenzophenones, trihydroxybenzophenones, novolaks derived from formaldehyde and either a mixture of o-, m- and p-cresols or a mixture of phenol and p-tert.butylphenol.

The photosensitive quinone diazides (B) hereinbefore described are either commercially available or may be prepared by conventional methods, for example by reacting a phenol with an esterifying derivative of an o-quinone diazide sulphonic acid, usually the sulphonyl chloride thereof, under conventional conditions.

As already indicated, the electrodepositable resinous component, i.e. (A) and/or (C), is present in the aqueous solution or dispersion in at least partially ionised form. Acids suitable for addition to the resins to effect at least partial neutralisation thereof include organic acids such as acetic, propionic, lactic, maleic, p-toluenesulphonic and glycolic acids and inorganic acids such as hydrochloric and sulphuric acids. Bases suitable for addition to the resin to effect at least partial neutralisation thereof include organic bases such as triethylamine, benzyldimethylamine, morpholine and 2-(dimethylamino)ethanol and inorganic bases such as sodium or potassium hydroxide or carbonate and ammonia.

Minor amounts, compared with the volume of water, of an organic solvent such as a ketone, alcohol, ether or ester may be included in the aqueous composition. Suitable organic solvents include acetone, methyl ethyl ketone, methyl isobutyl ketone, ethanol, isopropanol, 2-methoxyethanol, 2-ethoxyethanol, 2-n-butoxyethanol, diethylene glycol monobutyl ether, 2-methoxypropyl acetate, 2-ethoxyethyl acetate (oxitol acetate) and mixtures of two or more therof. Photosensitisers such as Michler's ketone, benzoin ethers, benzil ketals and thioxanthones may also be incorporated in the aqueous composition.

When the photosensitive component of the aqueous solution or dispersion is provided solely or mainly by an o-quinone diazide compound (B), the electrodepositable resin (C) and the compound (B) are generally used in amounts such that the aqueous solution or dispersion contains, by weight, at least 0.05 part of (B) per part of (C). Where the quinone diazide (B) is itself resinous, it is conveniently present in an amount of 0.5 to 1.5 parts, preferably 0.75 to 1.25 parts, per part by weight of (C). When (B) is not resinous, it is conveniently present in an amount of 0.05 to 0.7 part, preferably 0.1 to 0.5 part, per part by weight of (C).

In preparing the aqueous solution or dispersion, the resin (A) and, when present, (B), (C) and (D), together with any other optional ingredients, are usually dissolved in the organic solvent and the resulting mixture is diluted with water to give an aqueous composition suitable for use as an electrodeposition medium. The aqueous composition, which can be a solution but is usually a dispersion, generally has a solids content of 2 to 40%, preferably 5 to 20% by weight.

Electrodeposition of the photoresist layer from the aqueous solution or dispersion may be carried out using conventional electrodeposition procedures for resinous materials. Thus, the substrate on which the image is to be formed is immersed as an electrode in the aqueous composition, either as cathode or anode according to the nature of the electrodepositable resin and its partial neutralisation, another conductive material such as a metal sheet is immersed as the other electrode and an electric current is passed through the aqueous composition to deposit the photoresist layer as a photosensitive film of the required thickness on the substrate which is to have the image formed thereon. Voltages of up to 200 volts for periods of up to 5 minutes are generally used, but the precise conditions for particular resins, substrates and desired thicknesses may be readily determined by those skilled in the art of electrodepositing resinous materials. After electrodeposition, the substrate bearing the photoresist layer is removed from the aqueous composition and is usually rinsed and then heated at a temperature up to 90° C. to dry the photosensitive layer.

The substrate on which the photoresist layer is deposited may be of an electrically conductive plastics material, for example a thermoset resin containing electrically conductive particles distributed therein. Preferably, it is of a metal such as copper or aluminium, either as a solid metal sheet or as a metal-clad laminate which may have metal-lined through-holes or vias. Thus the process of the invention is useful in the production of printing plates and printed circuits.

Subjection of the electrodeposited layer to radiation in a predetermined pattern in stage (ii) of the process of the invention may be achieved by exposure through an image-bearing transparency consisting of substantially opaque and substantially transparent areas, or by means of a computer-controlled laser beam. Electromagnetic radiation having a wavelength of 200–600 nm is generally used, and suitable sources include carbon arcs, mercury vapour arcs, fluorescent lamps with phosphors emitting ultraviolet light, argon and xenon glow lamps, tungsten lamps, and photographic flood lamps; of these, mercury vapour arcs and metal halide lamps are the most suitable. The exposure time required depends on such factors as the nature of the components of the photoresist layer, the thickness of the electrodeposited layer, the type of radiation source, and its distance from the layer. Suitable exposure times can readily be found by routine experimentation.

After irradiation in stage (ii), the photoresist layer is heated in stage (iii) so that areas thereof exposed in stage (ii) are rendered insoluble in aqueous base. Of course, as will be understood by those skilled in the art of image formation from quinone diazides, heating of the layer to a temperature at which quinone diazide residues decompose should be avoided. Usually stage (iii) is effected at 80° to 120° C., preferably 90° to 110° C. Suitable heating durations can readily be found by routine experimentation. In stage (iv), the photoresist layer is conveniently subjected to blanket irradiation using as a source one of the radiation sources hereinbefore described as suitable for the imagewise irradiation. Again, suitable irradiation times can be found readily by routine experimentation.

In stage (v), areas of the photoresist layer not exposed in stage (ii) (but which are, of course, exposed in stage (iv)) are removed by treating the layer with an aqueous base as developer. Suitable developers are aqueous solutions containing 0.5 to 5% by weight of sodium or potassium hydroxide or carbonate, which may contain small amounts of surfactant and water-miscible organic solvent to aid development.

The image obtained on development consists of areas of the surface of the substrate (which have been exposed by development) and areas of residual photoresist layer overlying the remainder of the substrate. When the surface of the substrate is metallic, the metal exposed by development may be etched, either to remove metal or to increase the depth of the image and hence increase its differentiation, the residual photoresist layer in the remaining areas protecting the underlying substrate from attack. Such etching procedures, for example, using ferric chloride or ammonium persulphate solutions on copper substrates, are well known. The residual photoresist layer can then be removed by, for example, treatment with a more powerful solvent than that used for image development, for example a more concentrated solution of the same base, or by treatment with the same solvent as used for development but under more severe conditions, for instance with longer contact between the layer and the solvent. Suitable resist-removing agents include aqueous solutions containing 1–10% by weight of sodium or potassium hydroxide or carbonate and organic solvents such as acetone, methyl ethyl ketone, 2-ethoxyethanol, 2-n-butoxyethanol, 2-ethoxyethyl acetate, toluene, or mixtures of two or more thereof. When the substrate is a metal-clad plastics laminate, removal of the residual resist produces an image, in metal, on the plastics laminate.

The process of the invention is useful in the production of printed circuit boards with buried via holes, that is multilayer boards made using metal-clad plastics laminates having through hole-plated via holes which interconnect the conductive tracking on their two sides. When such laminates are used in the process of the invention, the electrodeposited photosensitive film is imagewise irradiated so that the parts of the film coating the via holes are exposed to the radiation in stage (ii), for example by aligning the via holes with transparent areas of an image-bearing mask.

The invention is illustrated by the following Examples, in which all parts and percentages are by weight unless stated otherwise.

EXAMPLE 1

A novolak resin prepared from phenol (2.25 mols), p-tert.butylphenol (0.75 mol) and formaldehyde (2.7 mols) is reacted with 1,2-naphthoquinone-2-diazide-5-sulphonyl chloride until 12% of the free hydroxyl groups on the novolak have been esterified. The resultant resin (100 g) is dissolved in 2-n-butoxyethanol (150 g) and heated to 70° C. A solution containing diethanolamine (15.75 g), formalin solution (23.5 g: 38.3% HCHO), aqueous lactic acid solution (18 g; 75% lactic acid) and 2-n-butoxyethanol (25 g) is added to the heated resin solution and the temperature maintained at 70° C. for 4 hours. The resulting solution is cooled and diluted with water (500 g). The diluted solution is added to water (3000 g) containing sodium hydroxide (4.8 g), when a precipitate is formed. The precipitate is washed with water and dried in a vacuum oven at 35° C. to give 110 g of a solid.

A portion of this solid (4 g) is added slowly to a mixture of 2-n-butoxyethanol (4 g) and aqueous 20% lactic acid (1.34 g) to give a red-brown solution. This solution is diluted with water to give a dispersion having a 10% solids content. A copper-clad laminate and a stainless steel sheet are immersed in the dispersion as cathode and anode respectively. An electric current is passed through the dispersion at 20 volts for 1 minute to deposit a resinous film on the laminate. The laminate is removed from the dispersion, rinsed in water and dried at 90° C. for 5 minutes, after which the electrodeposited film is a tack-free solid layer having a thickness of 6 micrometres. The dried film is irradiated through an image-bearing transparency for 30 seconds using a 5000w metal halide lamp at a distance of 75 cm. The laminate is then heated at 90° C. for 10 minutes before being irradiated again, for 30 seconds, using the same lamp but without the image-bearing transparency. Immersion in aqueous 2% sodium hydroxide gives a clear negative image of the transparency.

EXAMPLE 2

A solution of poly(p-vinylphenol) having a weight average molecular weight of 10,000 and available from Maruzen Oil Co. Ltd., Tokyo, Japan, under the designation "Resin M Grade S-3" (686 g) in methyl ethyl ketone (460 g) is prepared. To this solution is added phenyl glycidyl ether (22 g) and triethylamine (3.5 g) and the resulting mixture is heated at 80° C. for 7½ hours. The reaction mixture is reduced in volume by vacuum distillation and the remaining resinous solid is dissolved in methanol (350 g). The resulting solution is added slowly to water (3,500 g). A buff-coloured precipitate is obtained which is washed with water and dried in a vacuum oven.

A portion of the dried solid (30 g) is dissolved in acetone (60 g) and a solution of 1,2-naphthoquinone-2-diazide-5-sulphonyl chloride (10 g) in acetone (20 g) is added, followed by aqueous 5% sodium carbonate to bring the mixture to pH 8. The mixture is stirred for 1 hour at room temperature and then added slowly to an aqueous solution of hydrochloric acid (15 g conc. HCl in 1,500 g water). The precipitate formed is filtered off and dried in a vacuum oven at 35° C.

Part of the resulting solid (10 g) is dissolved in 2-n-butoxyethanol (20 g) and treated with diethanolamine (1.1 g), formalin (1.55 g; 38.3% HCHO) and aqueous lactic acid (1.2 g; 75% lactic acid). The mixture is heated at 70° C. for 4 hours, then cooled and diluted with water (50 g). The diluted solution is added slowly to water (500 g) containing sodium hydroxide (0.8 g). The precipitate formed is filtered off and dried in a vacuum oven at 35° C.

A portion of the dried solid (4 g) is added slowly to a mixture of 2-n-butoxyethanol (4 g) and aqueous 20% lactic acid (1.0 g) to give a red-brown solution. This solution is diluted with water to give a dispersion having a 10% solids content. A copper-clad laminate and a stainless steel sheet are immersed in the dispersion as cathode and anode respectively. An electric current is passed through the dispersion at 20 volts for 1 minute to deposit a resinous film on the laminate. The laminate is removed from the dispersion, rinsed in water and dried at 90° C. for 5 minutes, after which the electrodeposited film is a tack-free solid layer having a thickness of 9 micrometers. The dried film is irradiated through an image-bearing transparency for 30 seconds using a 5000 w metal halide lamp at a distance of 75 cm. The laminate is then heated at 90° C. for 10 minutes before being irradiated again, for 30 seconds, using the same lamp but without the image-bearing transparency. Immersion in aqueous 1% sodium hydroxide gives a clear negative image of the transparency.

EXAMPLE 3

A novolak resin prepared from phenol (2.25 mols), p-tert.butylphenol (0.75 mol) and formaldehyde (2.7 mols) is reacted with 1,2-naphthoquinone-2-diazide-5-sulphonyl chloride until 12% of the free hydroxyl groups on the novolak have been esterified. The resultant resin (100 g) is dissolved in 2-n-butoxyethanol (200 g) and heated to 50° C. A solution containing sarcosine (5.34 g), paraformaldehyde (3.96 g; 91% HCHO), aqueous 20% sodium hydroxide (12 g) and 2-n-butoxyethanol (25 g) is added to the heated resin solution and the temperature maintained at 50° C. for 3 hours. The resulting solution is cooled and diluted with water (500 g). The diluted solution is added to water (3000 g) containing hydrochloric acid (10 g conc. HCl). The precipitate obtained is filtered off, washed with water and dried in a vacuum oven at 35° C.

A portion of the dried solid (4 g) is added slowly to a mixture of 2-n-butoxyethanol (4 g) and aqueous 20% potassium hydroxide (0.6 g) to give a red-brown solution. This solution is diluted with water to give a dispersion having a 10% solids content. A copper-clad laminate and a stainless steel sheet are immersed in the dispersion as anode and cathode respecively. An electric current is passed through the dispersion at 120 volts for 1 minute to deposit a resinous film on the laminate. The laminate is removed from the dispersion, rinsed in water and dried at 90° C. for 5 minutes, after which the electrodeposited film is a tack-free solid layer having a thickness of 9 micrometers. The dried film is irradiated through an image-bearing transparency for 60 seconds using a 5000 w metal halide lamp at a distance of 75 cm. The laminate is then heated at 90° C. for 10 minutes before being irradiated again, for 60 seconds, using the same lamp but without the image-bearing transparency. Immersion in aqueous 2% sodium hydroxide gives a clear negative image of the transparency.

EXAMPLE 4

A novolak resin prepared from phenol (2.25 mols), p-tert.butylphenol (0.75 mol) and formaldehyde (2.7 mols) is reacted with 1,2-naphthoquinone-2-diazide-5-sulphonyl chloride until 12% of the free hydroxyl groups on the novolak have been esterified. The resultant resin (30 g) is dissolved in acetone (50 g) and heated to 60° C. A solution containing glutaric anhydride (0.86 g), triethylamine (0.17 g) and acetone (10 g) is added to the heated resin solution and the temperature maintained at 60° C. for 4 hours. The resulting solution is cooled and diluted with water (100 g) containing sodium hydroxide (0.3 g). The diluted solution is added to water (500 g) containing hydrochloric acid (1.5 g conc. HCl). The precipitate formed is filtered off, washed with water and dried in a vacuum oven at 35° C.

A portion of the resulting solid (4 g) is added slowly to a mixture of 2-n-butoxyethanol (4 g), aqueous 20% potassium hydroxide (0.4 g) and 1-hydroxyethyl-2-alkylimidazoline, where the 2-alkyl residue has 7 to 17 carbon atoms, available from Mona Industries Inc., Patterson, N.J., U.S.A. under the designation Monazoline C, (0.1 g), to give a red-brown solution. This solution is diluted with water to give a dispersion having a 10% solids content. A copper-clad laminate and a stainless steel sheet are immersed in the dispersion as anode and cathode respectively. An electric current is passed through the dispersion at 100 volts for 1 minute to deposit a resinous film on the laminate. The laminate is removed from the dispersion, rinsed in water and dried at 90° C. for 5 minutes, after which the electrodeposited film is a tack-free solid layer having a thickness of 10 micrometres. The dried film is irradiated through an image-bearing transparency for 60 seconds using a 5000 w metal halide lamp at a distance of 75 cm. The laminate is then heated at 110° C. for 10 minutes before being irradiated again, for 60 seconds, using the same lamp but without the image bearing transparency. Immersion in aqueous 2% sodium hydroxide gives a clear negative image of the transparency.

What is claimed is:

1. A process for the formation of an image which comprises
   (i) electrodepositing on a conductive surface a layer of a 1,2 naphthoquinone-2-diazide-5-sulphonyl ester positive photoresist,
   (ii) subjecting the layer to radiation in a predetermined pattern,
   (iii) heating the layer such that areas thereof exposed in stage (ii) are rendered insoluble in an aqueous base developer,
   (iv) subjecting the layer to radiation such that areas not exposed in stage (ii) are rendered more soluble in an aqueous base developer than the areas rendered insoluble in stage (iii) and
   (v) removing the areas not exposed in stage (ii) by treatment with an aqueous base developer.

2. A process according to claim 1, in which the photoresist layer is formed by electrodeposition from a solution or dispersion in an aqueous medium of
   (A) a film-forming electrodepositable resin having a photosensitive 1,2-naphthoquinone-2-diazide-5-sulphonyl ester moiety; or
   a mixture of (B) a photosensitive 1,2-naphthoquinone-2-diazide-5-sulphonyl ester compound and (C) a film-forming electrodepositable resin; or
   a mixture of (A) with (B) or (C); or
   a mixture of (A), (B) and (C).

3. A process according to claim 2, in which resin (A) or resin (C) has a cationic amino group.

4. A process according to claim 3, in which (A) is an of a film-forming phenolic hydroxyl group-containing resin, said ester having at least one amino group which is present in at least partially ionized form in the aqueous medium.

5. A process according to claim 4, in which the phenolic hydroxyl group-containing resin is a novolak resin or a polymer of an ethylenically unsaturated phenol.

6. A process according to claim 5, in which the amino group is present in a group of formula $-CH(R^1)-N(R^3)-R^2-X$ attached to an aromatic ring in (A), where
   $R^1$ denotes a hydrogen atom or an alkyl, aryl or carboxylic acid group,
   $R^2$ denotes a divalent aliphatic, aromatic or araliphatic group,
   $R^3$ denotes a hydrogen atom, an alkyl group or an alkyl group substituted by a carboxyl or esterified carboxyl group or by a hydroxyl or etherified hydroxyl group,
   or $R^2$ and $R^3$ together form an alkylene chain of 2 to 5 carbon atoms or said alkylene chain containing an additional oxygen or nitrogen atom in the chain,
   X denotes a hydrogen atom, a carboxyl group, a hydroxyl group or an amino group of formula $-N(R^4)R^5$, and
   $R^4$ and $R^5$, which are the same or different, each denote a hydrogen atom, an alkyl, aryl, aralkyl or alkenyl group or a hydroxy-substituted alkyl, aryl, aralkyl or alkenyl group.

7. A process according to claim 6, in which
$R^1$ denotes a hydrogen atom or a methyl, ethyl, phenyl or carboxyl group,
$R^2$ denotes an alkylene group of 1 to 6 carbon atoms, or said alkylene group substituted by a carboxyl group, or a phenylene group,
$R^3$ denotes a hydrogen atom or an alkyl group of 1 to 6 carbon atoms, or said alkyl group substituted by a carboxyl or hydroxyl group, or $R^2$ and $R^3$ together form an alkylene chain of 4 carbon atoms containing an oxygen atom or an additional nitrogen atom in the chain, or an alkylene chain of 5 carbon atoms,
X denotes a hydrogen atom, a carboxyl or hydroxyl group or an amino group of formula $-N(R^4)R^5$ where $R^4$ and $R^5$ each denote a hydrogen atom or an alkyl group of 1 to 6 carbon atoms.

8. A process according to claim 5, in which the phenolic hydroxyl group-containing resin is
a novolak resin derived from formaldehyde and an alkyl substituted phenol or a mixture thereof with phenol; or
a polymer of p-vinylphenol.

9. A process according to claim 3, in which resin (C) has an amino group present in the aqueous medium in at least partially ionized form and is
a reaction product of a novolak resin, an aldehyde and a primary or secondary amine or an aminocarboxylic acid; or
a polymer of an acrylate or methacrylate containing a tertiary amino group.

10. A process according to claim 2, in which resin (A) or resin (C) has no cationic amino group and the aqueous medium contains a material (D) which interacts with material produced in exposed areas in stage (ii) to produce aqueous base-insoluble material on heating in stage (iii).

11. A process according to claim 10, in which (A) is an ester of a film-forming phenolic hydroxyl group-containing resin, said ester having at least one carboxyl group which is present in at least partially ionized form in the aqueous medium.

12. A process according to claim 11, in which the phenolic hydroxyl group-containing resin is a novolak resin or a polymer of an ethylenically unsaturated phenol.

13. A process according to claim 12, in which (A) is a resin obtained by reacting the phenolic hydroxyl group-containing resin partially with an o-naphthoquinone diazide 5-sulfonic acid or esterifying derivative thereof and partially with a polycarboxylic acid anhydride.

14. A process according to claim 11, in which the phenolic hydroxyl group-containing resin is
a novolak resin derived from formaldehyde and an alkyl substituted phenol or mixture thereof with phenol; or
a polymer of p-vinylphenol.

15. A process according to claim 10, in which (C) has a carboxyl group present in the aqueous medium in at least partially ionized form and is a carboxyl-terminated diene polymer, a polymer of an ethylenically unsaturated carboxylic acid or a reaction product of a hydroxyl-containing resin with a polycarboxylic acid anhydride.

16. A process according to claim 10, in which (D) is an organic base.

17. A process according to claim 1, in which the layer is heated at a temperature of 80° C. to 120° C. in stage (iii).

18. A process according to claim 1, in which irradiation in stages (ii) and (iv) is effected using electromagnetic radiation having a wavelength of 200–600 nm.

19. A process according to claim 1, in which development in stage (v) is effected using an aqueous solution containing 0.5 to 5.0% by weight of sodium or potassium hydroxide or carbonate.

* * * * *